US011717936B2

(12) United States Patent
Sklyar et al.

(10) Patent No.: US 11,717,936 B2
(45) Date of Patent: Aug. 8, 2023

(54) METHODS FOR A WEB-BASED CMP SYSTEM

(71) Applicant: Applied Materials, Inc., Santa Clara, CA (US)

(72) Inventors: Dmitry Sklyar, San Jose, CA (US); Jeonghoon Oh, Saratoga, CA (US); Gerald J. Alonzo, Los Gatos, CA (US); Jonathan Domin, Sunnyvale, CA (US); Steven M. Zuniga, Soquel, CA (US); Jay Gurusamy, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1005 days.

(21) Appl. No.: 16/552,901

(22) Filed: Aug. 27, 2019

(65) Prior Publication Data

US 2020/0086456 A1 Mar. 19, 2020

Related U.S. Application Data

(60) Provisional application No. 62/731,362, filed on Sep. 14, 2018.

(51) Int. Cl.
*B24B 49/04* (2006.01)
*H01L 21/321* (2006.01)
(Continued)

(52) U.S. Cl.
CPC ............ *B24B 49/04* (2013.01); *B24B 37/005* (2013.01); *B24B 57/04* (2013.01); *H01L 21/3212* (2013.01); *H01L 21/67092* (2013.01)

(58) Field of Classification Search
None
See application file for complete search history.

(56) References Cited

U.S. PATENT DOCUMENTS 5,081,051 A 1/1992 Mattingly et al.
5,489,233 A 2/1996 Cook et al.
(Continued)

FOREIGN PATENT DOCUMENTS

CN 102152206 A * 8/2011 ........... B24B 21/004
EP 1025954 A2 * 8/2000 ............ B24B 21/04
(Continued)

OTHER PUBLICATIONS

Damour, Jeff—"The Mechanics of Tension Control," Converter Accessory Corporation white paper, Wind Gap, PA, http://www.converteraccessory.com/papers/tcpaper1.pdf, date unknown, pp. 1-29.
(Continued)

*Primary Examiner* — Sylvia MacArthur
(74) *Attorney, Agent, or Firm* — Patterson + Sheridan, LLP

(57) ABSTRACT

Embodiments of the present disclosure generally provide methods, polishing systems with computer readable medium having the methods stored thereon, to facilitate consistent tensioning of a polishing article disposed on a web-based polishing system. In one embodiment, a substrate processing method includes winding a used portion of a polishing article onto a take-up roll of a polishing system by rotating a first spindle having the take-up roll disposed thereon; measuring, using an encoder wheel, a polishing article advancement length of the used portion of the polishing article wound onto the take-up roll; determining a tensioning torque to apply to a supply roll using the measured polishing article advancement length; and tensioning the polishing article by applying the tensioning torque to the supply roll.

16 Claims, 3 Drawing Sheets

(51) Int. Cl.
*H01L 21/67* (2006.01)
*B24B 37/005* (2012.01)
*B24B 57/04* (2006.01)

(56) References Cited

U.S. PATENT DOCUMENTS

| | | | |
|---|---|---|---|
| 5,569,062 A | 10/1996 | Karlsrud | |
| 5,938,884 A | 8/1999 | Hoshizaki et al. | |
| 5,990,010 A | 11/1999 | Berman | |
| 6,022,268 A | 2/2000 | Roberts et al. | |
| 6,110,025 A | 8/2000 | Williams et al. | |
| 6,113,479 A | 9/2000 | Sinclair et al. | |
| 6,116,990 A | 9/2000 | Sinclair et al. | |
| 6,121,143 A * | 9/2000 | Messner | B24D 3/34 438/692 |
| 6,135,859 A | 10/2000 | Tietz | |
| 6,179,709 B1 | 1/2001 | Redeker et al. | |
| 6,196,896 B1 | 3/2001 | Sommer | |
| 6,241,583 B1 | 6/2001 | White | |
| 6,241,585 B1 | 6/2001 | White | |
| 6,244,935 B1 | 6/2001 | Birang et al. | |
| 6,261,959 B1 | 7/2001 | Travis et al. | |
| 6,276,998 B1 | 8/2001 | Sommer et al. | |
| 6,302,767 B1 | 10/2001 | Tietz | |
| 6,306,019 B1 | 10/2001 | Finkelman | |
| 6,312,319 B1 | 11/2001 | Donohue et al. | |
| 6,354,930 B1 | 3/2002 | Moore | |
| 6,413,873 B1 | 7/2002 | Li et al. | |
| 6,419,559 B1 | 7/2002 | Gurusamy et al. | |
| 6,428,394 B1 | 8/2002 | Mooring et al. | |
| 6,447,374 B1 | 9/2002 | Sommer et al. | |
| 6,475,070 B1 | 11/2002 | White | |
| 6,491,570 B1 | 12/2002 | Sommer et al. | |
| 6,494,769 B1 | 12/2002 | Sinclair et al. | |
| 6,500,056 B1 | 12/2002 | Krusell et al. | |
| 6,514,863 B1 | 2/2003 | He | |
| 6,520,833 B1 * | 2/2003 | Saldana | B24B 37/04 451/167 |
| 6,561,871 B1 | 5/2003 | Sommer | |
| 6,561,884 B1 * | 5/2003 | White | B24B 21/008 451/307 |
| 6,592,439 B1 | 7/2003 | Li et al. | |
| 6,607,425 B1 * | 8/2003 | Kistler | B24B 37/16 451/41 |
| 6,616,801 B1 | 9/2003 | Boyd | |
| 6,626,744 B1 | 9/2003 | White et al. | |
| 6,641,471 B1 | 11/2003 | Pinheiro et al. | |
| 6,659,849 B1 * | 12/2003 | Li | B24B 21/14 451/72 |
| 6,800,020 B1 | 10/2004 | Boyd et al. | |
| 6,837,964 B2 | 1/2005 | Franklin et al. | |
| 6,931,330 B1 | 8/2005 | Yi et al. | |
| 6,991,517 B2 | 1/2006 | Redeker et al. | |
| 7,014,538 B2 | 3/2006 | Tietz et al. | |
| 7,037,174 B2 | 5/2006 | Chen et al. | |
| 7,097,544 B1 | 8/2006 | Tolles et al. | |
| 7,611,400 B2 | 11/2009 | Yilmaz et al. | |
| 7,614,939 B2 | 11/2009 | Tolles et al. | |
| 2002/0052171 A1 * | 5/2002 | Birang | B24B 37/04 451/36 |
| 2002/0081945 A1 | 6/2002 | Kistler et al. | |
| 2002/0123298 A1 | 9/2002 | Krusell et al. | |
| 2002/0127959 A1 * | 9/2002 | Gurusamy | B24B 21/04 451/173 |
| 2002/0142710 A1 * | 10/2002 | Saldana | B24B 21/08 451/168 |
| 2003/0013384 A1 | 1/2003 | Donohue et al. | |
| 2003/0040182 A1 * | 2/2003 | Hsu | C09G 1/04 438/692 |
| 2003/0060143 A1 | 3/2003 | Birang et al. | |
| 2003/0066604 A1 * | 4/2003 | Franklin | B24B 21/04 156/345.23 |
| 2003/0139124 A1 | 7/2003 | Xu | |
| 2003/0224678 A1 | 12/2003 | Hsu et al. | |
| 2006/0003677 A1 * | 1/2006 | Park | B24B 57/04 451/285 |
| 2006/0063469 A1 * | 3/2006 | Talieh | B24B 21/08 451/41 |
| 2006/0172664 A1 | 8/2006 | Chen et al. | |
| 2006/0194525 A1 | 8/2006 | Tolles et al. | |
| 2007/0021043 A1 | 1/2007 | Birang et al. | |
| 2007/0197132 A1 | 8/2007 | Menk et al. | |
| 2007/0197133 A1 | 8/2007 | Menk et al. | |
| 2007/0197134 A1 | 8/2007 | Menk et al. | |
| 2007/0197141 A1 | 8/2007 | Zuniga et al. | |
| 2007/0197145 A1 | 8/2007 | Menk et al. | |
| 2007/0197147 A1 | 8/2007 | Rondum et al. | |
| 2007/0212976 A1 * | 9/2007 | McReynolds | B24B 37/20 451/526 |
| 2007/0298692 A1 * | 12/2007 | Mavliev | B24B 53/017 451/56 |
| 2008/0076330 A1 | 3/2008 | Birang et al. | |
| 2009/0253358 A1 | 10/2009 | Menk et al. | |
| 2009/0325465 A1 | 12/2009 | Takahashi et al. | |
| 2010/0105290 A1 * | 4/2010 | Sakata | B24B 49/12 451/301 |
| 2010/0112919 A1 * | 5/2010 | Bonner | B24B 37/205 451/538 |
| 2011/0312182 A1 | 12/2011 | Borucki et al. | |
| 2015/0258653 A1 * | 9/2015 | Seki | B24B 21/02 451/303 |
| 2019/0030677 A1 * | 1/2019 | Oh | B24B 49/105 |
| 2020/0086456 A1 * | 3/2020 | Sklyar | B24B 49/04 |

FOREIGN PATENT DOCUMENTS

| | | |
|---|---|---|
| JP | 2012-166326 A | 9/2012 |
| JP | 2013-240844 A | 12/2013 |
| WO | 9845087 A1 | 10/1998 |
| WO | 9933615 A1 | 7/1999 |
| WO | WO-2006103859 A1 * | 10/2006 ............... B08B 1/04 |

OTHER PUBLICATIONS

PCT International Search Report and Written Opinion dated Dec. 16, 2019, for International Application No. PCT/US2019/048634.

* cited by examiner

METHODS FOR A WEB-BASED CMP SYSTEM

CROSS-REFERENCE TO RELATE APPLICATIONS

This application claim benefit of U.S. Provisional Patent Application Ser. No. 62/731,362, filed on Sep. 14, 2018 which is herein incorporated by reference in its entirety.

BACKGROUND

Field

Embodiments described herein generally relate to semiconductor device manufacturing, in particular, to methods of tensioning a polishing article disposed on a web-based chemical mechanical polishing (CMP) system.

Description of the Related Art

Chemical mechanical polishing (CMP) is used in semiconductor device manufacturing to planarize or polish a material layer disposed on a substrate surface. Typically, to planarize or polish the material layer, the substrate, and thus the material layer, is urged against a polishing article in the presence of a polishing fluid and abrasive particles. Generally, the polishing article will deteriorate with repeated use due to wear of the polishing article surface, accumulation of polishing by-products thereon or therein, or both. Deterioration of the polishing article eventually results in undesirable drifts in material layer removal rates between substrates processed on the polishing article, i.e., substrate to substrate material rate non-uniformity, and undesirable degradation in a material layer removal uniformity across the surface of a substrate, i.e., within substrate material removal rate non-uniformity. Thus, in polishing systems where the polishing article is fixedly secured to a polishing platen, the polishing article will need to be periodically removed and replaced which results in undesirable system downtime and reduced substrate processing capacity.

In a web-based CMP system, e.g., a polishing system where the polishing article comprises a flexible material provided on a supply roll, an as yet unused portion of the polishing article is fed across a platen surface to provide undeteriorated polishing article surfaces to a polishing zone of the CMP system. The continuous or incremental introduction (feed) of unused polishing article into the polishing zone effectively eliminates or substantially reduces process variations in material layer removal on an individual substrate, as well as from substrate to substrate, due to degradation of the polishing article surface without the need for as frequent periods of expensive processing system downtime. Typically, the polishing article is fed across the polishing zone by unwinding an unused portion of the polishing article from a supply roll and concurrently or sequentially winding a used portion about a take-up roll. Often, once a desired length of unused polishing article is fed into the polishing zone, the polishing article is tensioned by applying a torque to the supply roll in a direction opposite the unwinding direction.

Typically, to maintain consistent tension on the polishing article, from substrate to substrate processed thereon, the torque on the supply roll is decreased at a linear rate relative to the decreasing supply roll radius. Unfortunately, conventional methods of determining the radius of the supply roll have proven unreliable for the next generation of polishing article materials, e.g., polishing articles having textured surfaces, which leads to inconsistent or improper tensioning thereof. In a web-based CMP system, inconsistent or improper tensioning can cause the polishing article to break, stretch, or wrinkle which leads to inconsistent substrate processing results or undesirable system downtime.

Accordingly, there is a need in the art for improved methods of tensioning a polishing article disposed on a web-based polishing system.

SUMMARY

Embodiments of the present disclosure generally provide methods, and computer readable medium having the methods stored thereon, to facilitate consistent tensioning of a polishing article disposed on a web-based polishing system.

In one embodiment, a substrate processing method includes winding a used portion of a polishing article onto a take-up roll of a polishing system by rotating a first spindle having the take-up roll disposed thereon, measuring, using an encoder wheel, a polishing article advancement length of the used portion of the polishing article wound onto the take-up roll, determining a tensioning torque to apply to a supply roll using the measured polishing article advancement length, and tensioning the polishing article by applying the tensioning torque to the supply roll.

In another embodiment, a method of tensioning a web of material includes advancing a web of material in a machine direction and tensioning the web material. Advancing the web material in the machine direction includes rotating a first spindle, having a take-up roll of the web material disposed thereon, to wind a portion of the web material onto the take-up roll, measuring, using an encoder wheel, a material advancement length of the portion of the web material wound onto the take-up roll; and measuring, using an angular encoder, an angular displacement of the spindle corresponding to the material advancement length. Tensioning the web of material includes determining a tensioning torque using the material advancement length measurement and the corresponding angular displacement measurement, and applying the tensioning torque to a second spindle having a supply roll of the web material disposed thereon.

In another embodiment, a polishing system having a computer readable medium having instructions stored thereon for a method of processing a substrate is provided. The method includes winding a used portion of a polishing article onto a take-up roll of a polishing system by rotating a first spindle having the take-up roll disposed thereon, measuring, using an encoder wheel, a polishing article advancement length of the used portion of the polishing article wound onto the take-up roll, determining a tensioning torque to apply to a supply roll using the measured polishing article advancement length, and tensioning the polishing article by applying the tensioning torque to the supply roll.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments described herein generally relate to methods of processing a substrate on a web-based chemical mechanical polishing (CMP) processing system. In particular, the methods provided herein facilitate consistent tensioning of a polishing article disposed on a web-based polishing system. Tension herein refers to the force applied to a continuous web of material, such as a polishing article, in the machine direction, i.e., the direction of travel of the polishing article between supply roll and a take-up roll, of the web-based processing system.

In some embodiments herein, the tension on the polishing article is adjusted by applying a torque to a supply roll spindle in a direction opposite to the feed direction of the polishing article. In some embodiments, simultaneously with applying the tensioning torque to the supply roll assembly, a brake is applied to a take-up roll assembly so that the polishing article does not unwind therefrom. In some embodiments, consistent tensioning of the polishing article includes adjusting the torque applied to the supply roll spindle to compensate for the decreasing radius of the supply roll (torque=tension×radius). Therefore, properly adjusting the torque on the supply roll typically includes determining the radius of the supply roll and adjusting the torque based thereon.

Conventional methods of determining the radius of a roll on a web-based processing system include measuring the radius at a location, on an outer surface of the roll using a contact sensor, such as a follower arm or lay-on roll type sensor, or a non-contact sensor, such as an ultra-sonic sensor. Contact sensors are generally unsuitable for use in determining the radius of the supply roll because they undesirably expose the polishing article to particulate contaminates which may be transferred from the contact sensor to the polishing surface of the polishing article. Likewise, non-contact sensors are generally unsuitable for use in determining the radius of a polishing article roll due to variations in the measurements cause by a textured polishing surface of the polishing article, such as variations in the measurement caused by protrusions or grooves respectively formed in or on the polishing article. Therefore, embodiments herein provide methods for determining the outer radius of a roll of continuous web material disposed on a web-based processing system without direct measurement thereof.

Figure 1A:
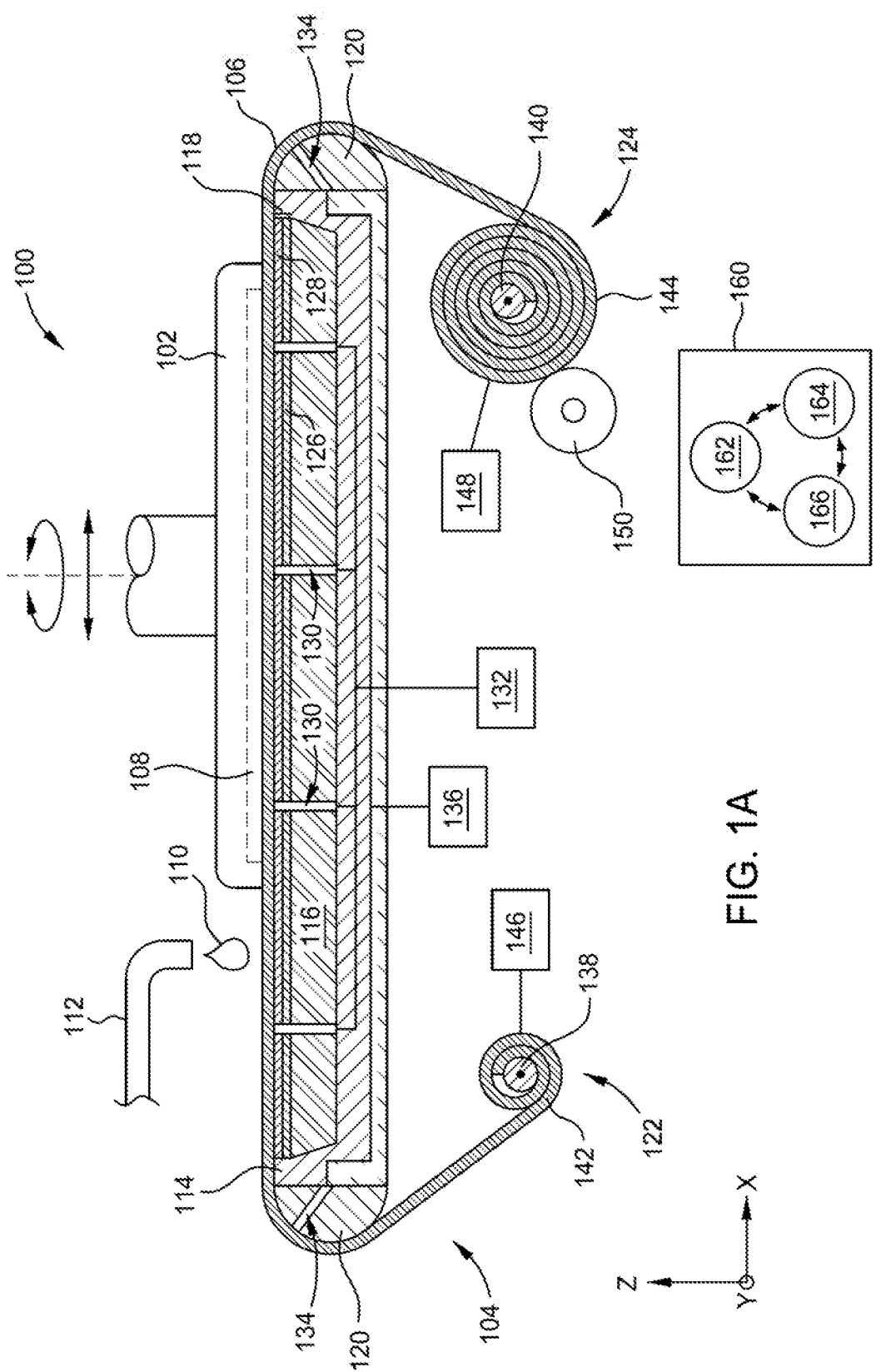
FIG. 1A is a schematic cross-sectional view of a polishing system configured to practice the methods set forth herein, according to one embodiment.
Figure 1B:
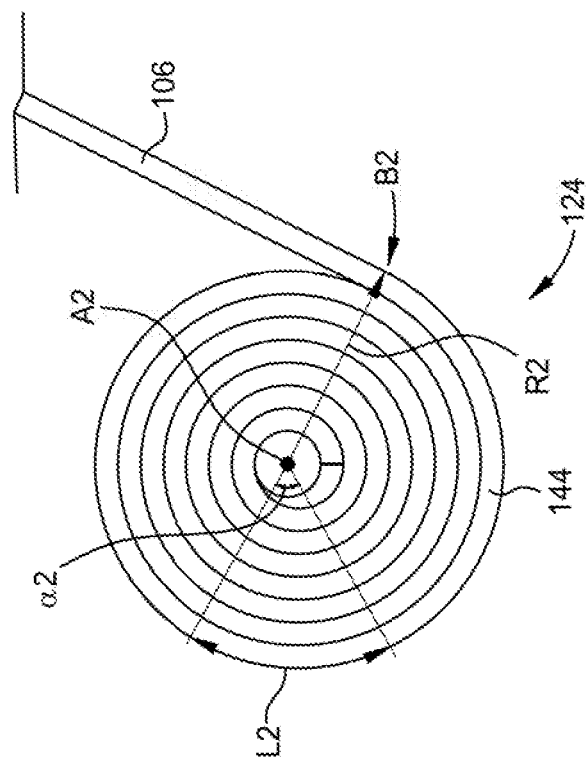
FIG. 1B shows portions of the polishing system described in FIG. 1A.

FIG. 1A is a schematic cross-sectional view of an exemplary polishing system configured to practice the methods set forth herein, according to one embodiment. FIG. 1B shows the supply roll and take-up roll of the polishing system described in FIG. 1A. In FIG. 1B cross-sectional hash marks have been removed from the polishing article 106 to aid in the clarity of the illustration.

Here, the processing system 100 features a substrate carrier 102 and a platen assembly 104 having a portion of a polishing article 106 disposed thereon. The substrate carrier 102 is used to urge a substrate 108 disposed therein against the polishing article 106 by exerting a downforce on the substrate 108 and moving the substrate 108 relative to the polishing article 106 in the presence of a polishing fluid 110 comprising abrasive particles suspended therein. Here, the polishing fluid 110 is delivered to the surface of the polishing article 106 using a fluid delivery arm 112 positioned there above. In some embodiments, the polishing article 106 may include the abrasive particles disposed thereon or embedded in the surface thereof. In some of those embodiments, the polishing fluid may not include abrasive particles.

The platen assembly 104 features a platform body 114 having a platen 116 disposed in a recessed surface thereof, a platen interface membrane 118 fixedly secured to the platen 116 by an adhesive or by mechanical means, web guides 120 disposed at either end of the platform body 114, a supply roll assembly 122, and a take-up roll assembly 124. Here, the platen interface membrane 118 comprises a multilayer stack including a subpad material layer 126 and a releasable bonding layer 128 disposed on the subpad material layer. In some embodiments, the subpad material layer 126 is formed of a fibrous mat, such as spun or molded polypropylene (PP), polyethylene (PE), polyester, or a combination thereof. Typically, the releasable bonding layer 128 features a non-slip surface used to prevent lateral movement of the polishing article 106 relative to the platen interface membrane 118 during substrate processing thereon. In some embodiments, the releasable bonding layer 128 comprises one or a combination of a silicone based material, a natural rubber, or a synthetic rubber.

To advance the polishing article 106 between substrate processings or between periods of substrate processing, the polishing article 106 is separated from the platen interface membrane 118 which allows the polishing article 106 to move relative thereto. In some embodiments, the polishing article 106 is separated from the platen interface membrane 118 using a separation fluid delivered to the interface disposed therebetween. Here, the separation fluid is delivered to the interface between the polishing article 106 and the platen interface membrane 118, herein a platen interfacial region, through a plurality of openings 130 disposed through the platen 116 and further through the platen interface membrane 118 disposed thereon. The plurality of openings are in fluid communication with a first fluid source 132, such as an $N_2$ source or a clean dry air (CDA) source, which provides the separation fluid thereunto.

The web guides 120 are used to guide the polishing article 106 over the edges of the platform body 114 as the polishing article 106 travels in the machine direction from the supply roll assembly 122 to the take-up roll assembly 124. Here, the web guides 120 are formed of a unitary body of material having a rounded convex surface (in cross section parallel to the machine direction). The web guides 120 are fixedly attached to the platform body 114 so that the rounded convex surfaces are positioned to face outwardly therefrom. In some embodiments, the web guides 120 feature one or more openings 134 formed in the rounded convex surfaces thereof. The one or more openings 134 are fluidly coupled to a second fluid source 136, such as an $N_2$ source, a CDA source, or a water source, which delivers the second fluid thereunto. The second fluid is used to lubricate the interface between the web guides 120 and the polishing article 106 disposed thereover which facilities advancement and tensioning of the polishing article 106 using the methods set forth herein. In other embodiments, one or more of the web guides 120 comprise a roller (not shown).

The supply roll assembly 122 and the take-up roll assembly 124 each include a spindle, here the supply spindle 138 and the take-up spindle 140, having a respective supply roll 142 and take-up roll 144 of portions of the polishing article 106 wound thereon. In some embodiments, the polishing article 106 comprises a thin, e.g., less than about 1 mm thick, polymeric sheet. In some embodiments, the polymeric sheet is formed of a non-porous thermoplastic material, such as polyethylene (PE), polypropylene (PP), polystyrene, polyethylene terephthalate (PET), polymethylmethacrylate (PMMA), polyvinyl alcohol (PVA), polyamides (e.g., nylon), polytetrafluoroethylene (PTFE) (i.e., TEFLON®), polyamides, polyurethane, or combinations thereof. In some embodiments, the polishing article 106 features a textured surface (not shown) comprising one or both of protrusions extending from a recessed region or grooves formed in the polishing surface to a depth which is less than the thickness of the polishing article 106. Typically, the textured surface is disposed on the polishing side of the polishing article and thus faces radially outward from the supply spindle 138 when the polishing article 106 is disposed on the supply roll 142.

The supply and take-up spindles 138, 140 are respectively coupled to first and second actuators 146, 148, shown here schematically. Typically, the first and second actuators 146, 148 each feature a motor and a rotary encoder configured to rotate the supply and take-up spindles 138, 140, determine an angular displacement thereof, apply a desired torque thereto, or a combination thereof. The take-up roll assembly 124 further includes an encoder wheel 150 mounted to roll along the surface of the polishing article 106 as the polishing article 106 is wound onto the take-up roll 144 and thus measure the length of the polishing article 106 traveling thereunder.

In some embodiments, advancing an unused portion of the polishing article 106 into the polishing zone includes introducing slack to the polishing article 106, winding a desired length of the polishing article 106 about the take-up roll 144, and tensioning the polishing article 106 using the first actuator 146 coupled to the supply roll 142. Providing slack to the polishing article 106 includes one or both of controllably reducing the tension of the polishing article 106 or unwinding a desired length, e.g., the first length L1 shown in FIG. 1B, of the polishing article 106 from the supply roll 142. Controllably reducing the tension of the polishing article 106 includes reducing the torque applied to the supply roll 142 or unwinding a desired length L1 therefrom. Controllably reducing the torque applied to the supply roll 142 or unwinding the desired length L1 therefrom both include determining a radius thereof, herein the supply roll radius R1 (shown in FIG. 1B), using embodiments described herein. Here, the supply roll radius R1 extends from the supply roll rotational axis A1 to a point of tangency B1 of the polishing article 106 disposed thereon. The point of tangency B1 is on an radially outwardly facing surface, e.g., a polishing surface, of the polishing article 106 where the polishing article 106 extends (in the machine direction) from the supply roll 142 towards the web guide 120 closest thereto.

Typically, the initial radius of a new supply roll (not shown) is known when the new supply roll is mounted on the processing system 100. As the supply roll 142 is used, the supply roll radius R1 decreases and take-up roll radius R2 proportionally increases. The take-up roll radius R2 extends from the take-up roll rotational axis A2 to a point of tangency B2 of the polishing article disposed thereon. The point of tangency B2 is on a radially outwardly facing surface, e.g., the polishing surface, of the polishing surface where the polishing surface extends (in the machine direction) from the take-up roll 144 towards the web guide 120 closest thereto.

Herein, the take-up roll radius R2 is determined using measurements obtained from the encoders of the of the take-up roll assembly 124. Specifically, the angular encoder of the second actuator 148 is used to measure the angular displacement $\alpha 2$ (shown in FIG. 1B) of the take-up roll 144 as a corresponding length L2 of polishing article 106 is wound thereon. Typically, the length L2 of polishing article wound onto the take-up roll is the same, or substantially the same, as the desired length of unused polishing article advanced into the polishing zone between processing substrates or between processing a series of substrates. Here, winding a desired length of the polishing article 106 about the take-up roll 144 includes rotating the take-up spindle 140, and thus the take-up roll 144 disposed thereon, until the desired length L2 of polishing article 106 is wound thereon. Typically, the second actuator 148 is communicatively coupled, e.g., servo-ed, to the encoder wheel 150 which rotates the take-up spindle 140 until the desired length of the polishing article 106, as measured by the encoder wheel 150, is wound thereon.

Using the angular displacement $\alpha 2$ of the take up roll 144 required to move the polishing article 106 on the outermost surface thereof the length L2, the take-up roll radius R2 is thus calculated using the equation $R2=(L2/2\pi)*(360/\alpha 2)$ where $\alpha 2$ is in degrees. In some embodiments, the supply roll radius R1 is calculated based on the initial radius of the supply roll 142, here R1' (not shown), the initial radius of the take up roll R2' (not shown), and the take-up roll radius R2 determined according to embodiments herein. For example, in some embodiments the supply roll radius R1 is calculated using the equation $R1=(R1'^2+R2'^2-R2^2)^{(1/2)}$. Thus, the supply roll radius R1 is determined using measurements obtained from the angular encoder of the second actuator 148 and the encoder wheel 150 of the take-up roll assembly 124 and the known initial radius of the supply roll and take up rolls.

In some embodiments, such as where the length L1 is substantially the same as the length L2, the radius of the supply roll may be calculated using the equation $R1=(L2/2\pi)*360/\alpha 1)$ where $\alpha 1$ is in degrees. Thus, in some embodiments, the supply roll radius R1 is determined using measurements obtained from the angular encoder of the first actuator 146 and the encoder wheel 150 of the take-up roll assembly 124.

Typically, tensioning the polishing article 106 includes applying a torque to the supply roll 142. In some embodiments, tensioning the polishing article 106 includes applying a torque to the supply roll 142 while simultaneously applying a brake to the take-up roll 144 to prevent unwinding the polishing article 106 therefrom. Here, the tension in the polishing article 106 is equal to the torque applied to the supply roll 142 divided by the supply roll radius R1. Therefore, to maintain a consistent tension on the polishing article 106 from substrate to substrate processed thereon, the torque applied to tension the supply roll 142 is decreased (reduced in magnitude) as the supply roll radius R1. Herein, the advancement and tensioning of the polishing article 106 and polishing of the substrate 108 thereon is controlled by a system controller 160 communicatively coupled to the processing system 100.

The system controller 160 includes a programmable central processing unit (CPU 162) which is operable with a memory 164 (e.g., non-volatile memory) and support circuits 166. The support circuits 166 are conventionally coupled to the CPU 162 and comprise cache, clock circuits, input/output subsystems, power supplies, and the like, and combinations thereof coupled to the various components of the processing system 100, to facilitate control thereof. The CPU 162 is one of any form of general purpose computer processor used in an industrial setting, such as a programmable logic controller (PLC), for controlling various components and sub-processors of the processing system 100. The memory 164, coupled to the CPU 162, is non-transitory and is typically one or more of readily available memories such as random access memory (RAM), read only memory (ROM), floppy disk drive, hard disk, or any other form of digital storage, local or remote.

Typically, the memory 164 is in the form of a computer-readable storage media containing instructions (e.g., non-volatile memory), that when executed by the CPU 162, facilitates the operation of the processing system 100. The instructions in the memory 164 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods) described herein.

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods described herein, or portions thereof, are performed by one or more application specific integrated circuits (ASICs), field-programmable gate arrays (FPGAs), or other types of hardware implementations. In some other embodiments, the methods described herein are performed by a combination of software routines, ASIC(s), FPGAs and, or, other types of hardware implementations.

Figure 1B:
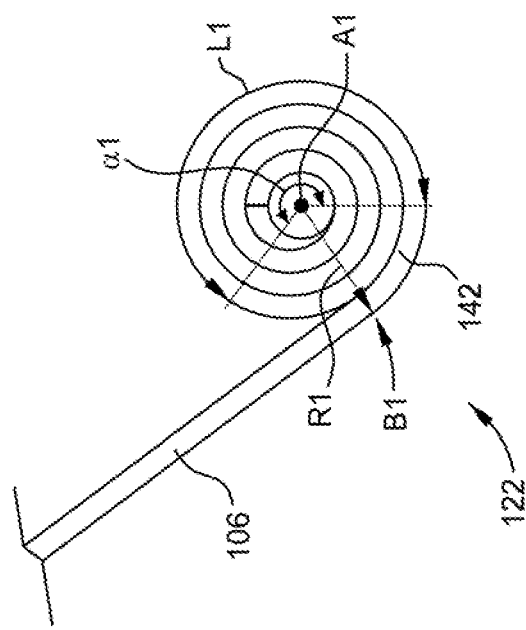
Figure 2:
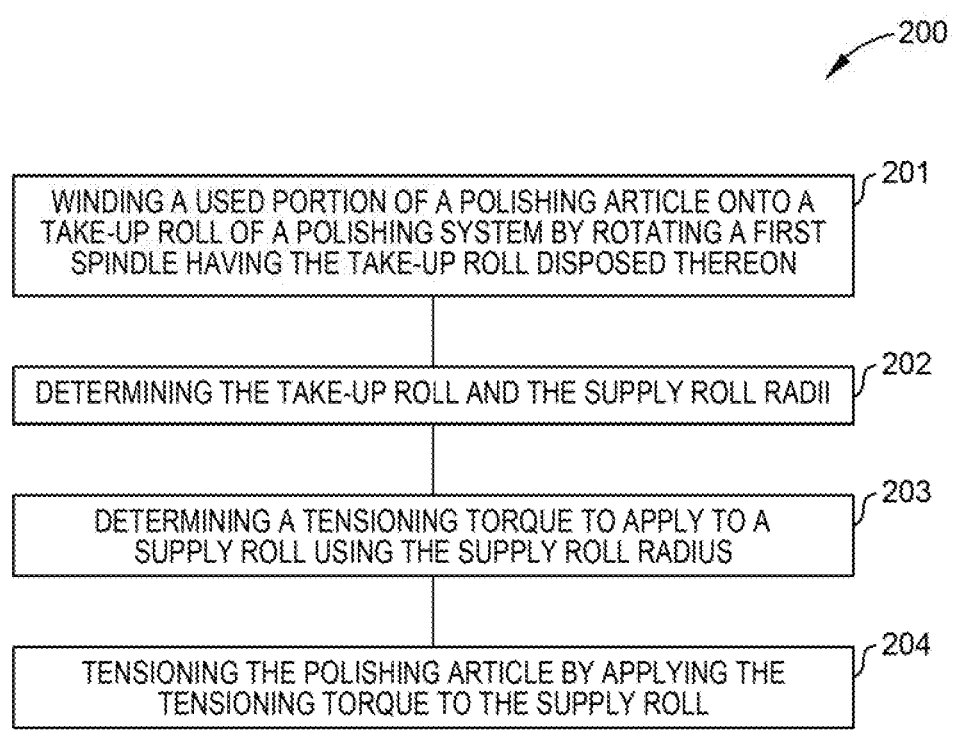
FIG. 2 is a flow diagram setting forth a method of processing a substrate, according to one embodiment.

FIG. 2 is a flow diagram setting forth a method 200 of tensioning a polishing article disposed on a web-based polishing system, such the exemplary web-based processing system 100 set forth in FIG. 1, according to one embodiment.

At activity 201 the method 200 includes winding a used portion of a polishing article onto a take-up roll of a polishing system by rotating a first spindle having the take-up roll disposed thereon. In some embodiments, the processing system comprising a supply roll assembly and a take-up roll assembly. The take-up roll assembly includes the first spindle, the take-up roll disposed on the first spindle, a first actuator coupled to the first spindle, and an encoder wheel. The supply roll assembly includes a second spindle, the supply roll disposed on the second spindle, and a second actuator coupled to the second spindle. Typically, the polishing article extends between the take-up roll and the supply roll in a machine direction.

In some embodiments, the processing system further includes a platen and a platen interface membrane disposed on the platen. In some embodiments, the processing system further includes a platform body having the platen disposed in a surface thereof and a plurality of web guides fixedly attached to opposite ends of the platform body. In some embodiments, each of the web guides have a respective opening formed therethrough.

At activity 202 the method 200 includes determining the take-up roll and the supply roll radii. Determining the take-up roll and the supply roll radii typically includes measuring, using an encoder wheel, a polishing article advancement length of the used portion of the polishing article wound onto the take-up roll. In some embodiments, determining the take-up roll radius includes measuring a polishing article advancement length, measuring an angular displacement of the take-up roll used to wind the used portion of the polishing article onto the take-up roll, and calculating the take-up roll radius based on the polishing article advancement length and the corresponding angular displacement of the take-up roll. Typically, the polishing article advancement length is the same, or substantially the same, as the desired length of unused polishing article advanced into the polishing zone between processing substrates or between processing a series of substrates. Substantially the same length as used herein recognizes that the length of polishing article advanced into the polishing zone may change due to stretching of the polishing article in the machine direction during subsequent tensioning and substrate processing operations.

At activity 203 the method 200 includes determining a tensioning torque to apply to a supply roll using the supply roll radius, e.g., by u the polishing article advancement length measurement. Here, the tensioning torque may be determined using the equation tensioning torque=desired tension×supply roll radius (e.g., R1 shown in FIG. 1B), where the supply roll radius is determined is determined using the advancement length measurement (e.g., L2 in FIG. 1B) according to embodiments described herein.

At activity 204 the method 200 includes tensioning the polishing article by applying the tensioning torque to the supply roll.

In some embodiments, the method 200 further includes flowing a first fluid into a region disposed between the polishing article and the platen interface membrane, herein a platen interfacial region. Typically, the first fluid comprises a gas, such as $N_2$ or clean dry air (CDA), which is delivered to the interfacial region through a plurality of openings disposed through the platen and platen interface membrane. The first fluid is used to separate the polishing article form the platen interface membrane and to facilitate lateral movement therebetween by providing lubrication at the interface thereof. Typically, the first fluid is flowed into the platen interfacial region before and concurrent with winding the polishing article about the take-up roll. In some embodiments, flowing the first fluid is stopped before tensioning of the polishing article.

In some embodiments, the method 200 further includes flowing a second fluid into web guide interfacial regions disposed between the polishing article and the web guides. Typically, the second fluid comprises a liquid, such as water, a gas, such as $N_2$ or CDA, or a combination thereof. Typically, the second fluid is flowed into the web guide interfacial regions before and concurrent with winding the polishing article about the take-up roll. In some embodiments, flowing the second fluid is stopped after tensioning the polishing article.

In some embodiments, the method 200 further includes determining the radius of the supply roll, comparing the radius of the supply roll to a desired minimum radius, and alerting a user of the processing system when the radius of the supply roll is less than the desired minimum radius.

The methods herein beneficially enable consistent tensioning of a roll of continuous web material disposed on a web-based processing system, such as a polishing article disposed on a polishing system, without direct measurement, with or without contact, of the radius of the supply roll thereof.

While the foregoing is directed to embodiments of the present disclosure, other and further embodiments of the disclosure may be devised without departing from the basic scope thereof, and the scope thereof is determined by the claims that follow.

The invention claimed is:

1. A substrate processing method, comprising:
   winding a used portion of a polishing article onto a take-up roll of a polishing system by rotating a first spindle having the take-up roll disposed thereon, the polishing system having a platform body having a platen disposed in a surface thereof, and a plurality of web guides fixedly attached to opposite ends of the platform body, wherein each of the web guides have a respective opening formed therethrough;
   measuring, using an encoder wheel, a polishing article advancement length of the used portion of the polishing article wound onto the take-up roll;
   determining a tensioning torque to apply to a supply roll using the polishing article advancement length measurement; and
   tensioning the polishing article by applying the tensioning torque to the supply roll around which a first portion of the polishing article is wound.

2. The method of claim 1, wherein the polishing system comprises:
   a take-up roll assembly comprising the first spindle, the take-up roll disposed on the first spindle, a first actuator coupled to the first spindle, and the encoder wheel; and
   a supply roll assembly comprising a second spindle, the supply roll disposed on the second spindle, and a second actuator coupled to the second spindle,
   wherein the polishing article extends between the take-up roll and the supply roll in a machine direction, and
   wherein the polishing article advancement length is measured in the machine direction.

3. The method of claim 2, wherein determining the tensioning torque comprises:
   measuring an angular displacement of the take-up roll used to wind the used portion of the polishing article, having the polishing article advancement length, onto the take-up roll; and
   calculating a supply roll radius based on the polishing article advancement length and a corresponding angular displacement of the take-up roll.

4. The method of claim 2, wherein the tensioning torque is determined using the polishing article advancement length and a corresponding angular displacement of the supply roll.

5. The method of claim 2, wherein the polishing system further comprises:
   a platen interface membrane disposed on the platen,
   wherein a portion of the polishing article that extends between the take-up roll and the supply roll is positioned on the platen interface membrane during substrate processing.

6. The method of claim 5, further comprising urging a to be polished surface of a substrate against the polishing article in the presence of a polishing fluid.

7. The method of claim 5, further comprising flowing a first fluid into a region disposed between the polishing article and the platen interface membrane.

8. The method of claim 5, wherein the platen interface membrane further comprises a releasable bonding layer that is fixedly secured to the platen, and on which a portion of the portion of the polishing article that extends between the take-up roll and the supply roll is positioned during the substrate processing.

9. The method of claim 8, wherein the releasable bonding layer comprises silicone, a natural rubber, or synthetic rubber.

10. The method of claim 8, wherein the platen interface membrane further comprises a subpad material layer that is disposed between the releasable bonding layer and the platen.

11. The method of claim 10, wherein the subpad material layer comprises a fibrous mat that comprises polypropylene, polyethylene, or polyester.

12. The method of claim 5, wherein the platen interface membrane comprises a subpad material layer that is that is fixedly secured to the platen and disposed between the portion of the polishing article and the platen during substrate processing.

13. The method of claim 12, wherein the subpad material layer comprises a fibrous mat that comprises polypropylene, polyethylene, or polyester.

14. The method of claim 1, further comprising flowing a second fluid through the respective openings into regions disposed between web guides and the polishing article disposed thereon.

15. The method of claim 1, wherein the polishing article comprises a non-porous thermoplastic material.

16. The method of claim 15, the polishing article comprises polyethylene (PE), polypropylene (PP), polystyrene, polyethylene terephthalate (PET), polymethylmethacrylate (PMMA), polyvinyl alcohol (PVA), polyamides (e.g., nylon), polytetrafluoroethylene (PTFE), polyamides, or polyurethane.

* * * * *